US010742183B2

United States Patent
Chen et al.

(10) Patent No.: US 10,742,183 B2
(45) Date of Patent: Aug. 11, 2020

(54) PROCESSING DEVICE FOR POSITION SENSING COMPRISING A TRANSFORMING DIFFERENTIAL CURRENT SIGNAL TO A VOLTAGE SIGNAL PERFORMANCE

(71) Applicant: Industrial Technology Research Institute, Hsinchu (TW)

(72) Inventors: Chien-Wen Chen, Hsinchu County (TW); Chih-Cheng Hsieh, Hsinchu (TW); You-Shin Chen, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 89 days.

(21) Appl. No.: 16/229,403

(22) Filed: Dec. 21, 2018

(65) Prior Publication Data

US 2020/0204128 A1 Jun. 25, 2020

(51) Int. Cl.
*G01D 5/38* (2006.01)
*H03F 3/45* (2006.01)
(Continued)

(52) U.S. Cl.
CPC .......... *H03F 3/45475* (2013.01); *G01D 5/34* (2013.01); *H03K 17/56* (2013.01);
(Continued)

(58) Field of Classification Search
CPC .... G01D 5/24438; G01D 5/2455; G01D 5/38; H02K 11/22
(Continued)

(56) References Cited

U.S. PATENT DOCUMENTS 4,743,774 A * 5/1988 Maeda ............. G11B 20/10009
250/570
5,821,528 A 10/1998 Liao et al.
(Continued)

FOREIGN PATENT DOCUMENTS

CN 201188619 Y 1/2009
TW 423164 B 2/2001
(Continued)

OTHER PUBLICATIONS

Nakhkoob et al., "High speed photodiodes in standard nanometer scale CMOS technology: a comparative study," Optics Express, May 2012, vol. 20, No. 10, OSA, US.
Toshimasa et al., "Dual PIN Photodiode For Phase Shift Keying Optical Telecommunication Systems," Yokogawa Technical Report English Edition, 2008, pp. 19-22, No. 46, Japan.
Larry A. Coldren, "Research in Optoelectronics (A)," 2006, 193 pages, The University of California Santa Barbara, US.
(Continued)

*Primary Examiner* — Que Tan Le

(57) ABSTRACT

A processing device for position sensing includes a plurality of light sensors, a signal processing unit, a current mirror unit and a transforming unit. The light sensors are spaced apart from each other and sense a light field to generate a plurality of position sensing current signals. The signal processing unit receives the position sensing current signals and provides a load isolation, so as to generate a first current signal and a second current signal. The second current signal is transmitted to a node. The first and second current signals respectively correspond to a first group and a second group of light sensors. The current mirror unit mirrors the first current signal to a third current signal. The third current is transmitted to the node. The transforming unit transforms a differential current signal formed by the second and third current signals on the node to a voltage signal.

12 Claims, 12 Drawing Sheets

(51) Int. Cl.
*H03K 17/56* (2006.01)
*G01D 5/34* (2006.01)

(52) U.S. Cl.
CPC .................. *H03F 2200/129* (2013.01); *H03F 2203/45116* (2013.01); *H03F 2203/45512* (2013.01); *H03F 2203/45544* (2013.01)

(58) Field of Classification Search
USPC ............................................ 250/214 R, 221
See application file for complete search history.

(56) References Cited

U.S. PATENT DOCUMENTS

| | | | |
|---|---|---|---|
| 5,880,461 | A | 3/1999 | Spear |
| 5,981,936 | A | 11/1999 | Fujiie |
| 7,531,776 | B2 | 5/2009 | Koide |
| 7,751,721 | B2 | 7/2010 | Hoshida et al. |
| 8,384,443 | B2 | 2/2013 | Chamakura |
| 9,191,586 | B2 | 11/2015 | Minlong |
| 9,209,221 | B2 | 12/2015 | Yang |
| 2012/0194264 | A1 | 8/2012 | Chamakura |
| 2012/0206735 | A1 | 8/2012 | Rutten |
| 2015/0009337 | A1 | 1/2015 | Minlong |

FOREIGN PATENT DOCUMENTS

| | | |
|---|---|---|
| TW | I305976 B | 2/2009 |
| TW | 201316536 A | 4/2013 |
| TW | 201738533 A | 11/2017 |
| TW | 201800722 A | 1/2018 |

OTHER PUBLICATIONS

Cesare et al., "On-chip detection performed by amorphous silicon balanced photosensor for lab-on chip application," Sending and Bio-Sensing Research 3, 2015, pp. 53-58, Elsevier, US.

Mizuno et al., "Bandwidth enhancement technique for TIA using flipped voltage follower," IEICE Electronics Express, May 2017, vol. 14, No. 10, pp. 1-6, IEICE, US.

Jeong et al., "Review of CMOS Integrated Circuit Technologies for High-Speed Photo-Detection," MDPI Journal, 2017, 40 pages, Sensors, US.

Bluzer et al., "Current readout of infrared detectors," Optical Engineering, Mar. 1987, Vo. 26, No. 3, pp. 241-248, US.

Houshyarifar, Vahid, "A Readout Circuit for Infrared Focal Plane Array Using Cascode Technique," Advances in Natural and Applied Sciences, Jul. 2011, pp. 1-5, US.

Hsieh, et al., "A New CMOS Readout Circuit Design for the IR FPA With Adaptive Gain Control and Current-Mode Background Suppression," 1996, pp. 137-140, IEEE, US.

Hsieh et al., "High-Performance CMOS Buffered Gate Modulation Input (BGMI) Readout Circuits for IR FPA," IEEE Journal of Solid-State Circuits, Aug. 1998, pp. 1188-1198, vol. 3, No. 8, IEEE, US.

Hsieh et al., "Focal-Plane-Arrays and CMOS Readout Techniques of Infrared Imaging Systems," IEEE Transactions on Circuits and Systems for Video Technology, Aug. 1997, pp. 594-605, vol. 7, No. 4, IEEE, US.

J. Yi et al.,"Injection efficiency for direct injection model in an optical sensor," Optoelectronics and Advanced Materials—Rapid Communications, Jun. 2009, pp. 600-603, vol. 3, No. 6, US.

Taiwan Patent Office, Notice of Allowance, Patent Application Serial No. 107146350, dated Jan. 21, 2020, Taiwan.

* cited by examiner

PROCESSING DEVICE FOR POSITION SENSING COMPRISING A TRANSFORMING DIFFERENTIAL CURRENT SIGNAL TO A VOLTAGE SIGNAL PERFORMANCE

TECHNICAL FIELD

The disclosure relates to a processing device for position sensing.

BACKGROUND

Generally, in the development and design of a grating positioning sensor, a structural arrangement of a plurality of light sensors is adopted. For a light field generated by the grating to be sensed, this structure uses a semiconductor process to manufacture the light sensor. An accurate structure is manufactured on a single substrate and the scale of the structure is reduced at the same time. A differential signal process between the light sensors is applied to improve the ability to suppress common-mode noise. In practical application, the light sensor is generally a light-to-current type. The current generated by the light sensor is able to calculate in the circuit, the current generated by the light sensor needs to be transformed to a voltage.

However, since the process causes that the light sensors have a structure with common polarity, it is difficult for the light sensors to achieve a sensing structure with differential current. In addition, since the light sensors and the contact points thereof have the impendence property, in the direct coupling high frequency circuit, the load effect of the impendence property may influence the injection efficiency of the signal and the operation bandwidth of other circuits. Therefore, how to effectively isolate the load effect of the impendence property have become important issues.

SUMMARY

The disclosure provides a processing device for position sensing, which includes a plurality of light sensors, a signal processing unit, a current mirror unit and a transforming unit. The light sensors are spaced apart from each other and the light sensors sense a light field to generate a plurality of position sensing current signals. The signal processing unit is coupled to the light sensors. The signal processing unit receives the position sensing current signals and provides a load isolation, so as to generate a first current signal and a second current signal. The second current signal is transmitted to a node. The first current signal corresponds to the position sensing current signals of a first group of light sensors. The second current corresponds to the position sensing current signals of a second group of light sensors. The current mirror unit is coupled to the signal processing unit. The current mirror unit receives the first current signal and mirrors the first current signal to a third current signal. The third current is transmitted to the node. The transforming unit is coupled to the node. The transforming unit receives a differential current signal formed by the second current signal and the third current signal on the node. The transforming unit transforms the differential current signal to a voltage signal.

BRIEF DESCRIPTION OF DRAWINGS

The disclosure can be more fully understood by reading the subsequent detailed description and examples with references made to the accompanying drawings, wherein.

DETAILED DESCRIPTION OF DISCLOSED EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, a person skilled in the art would selectively implement all or some technical features of any embodiment of the disclosure or selectively combine all or some technical features of the embodiments of the disclosure.

In each of the following embodiments, the same reference number represents the same or similar element or component.

Figure 1A:
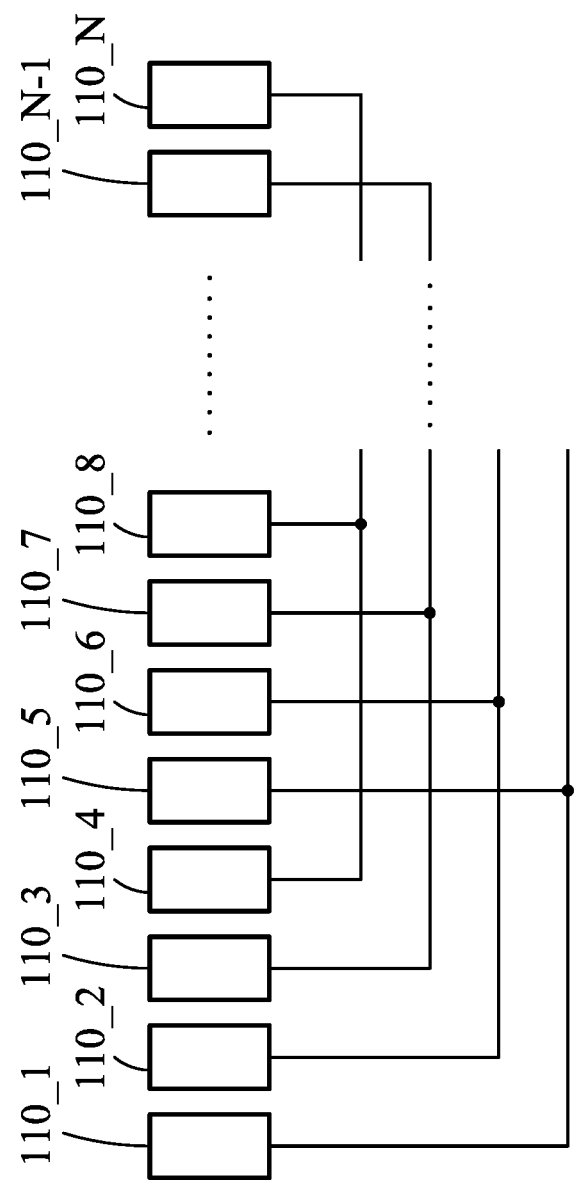
FIG. 1A is a schematic view of light sensors according to an embodiment of the disclosure.
Figure 1B:
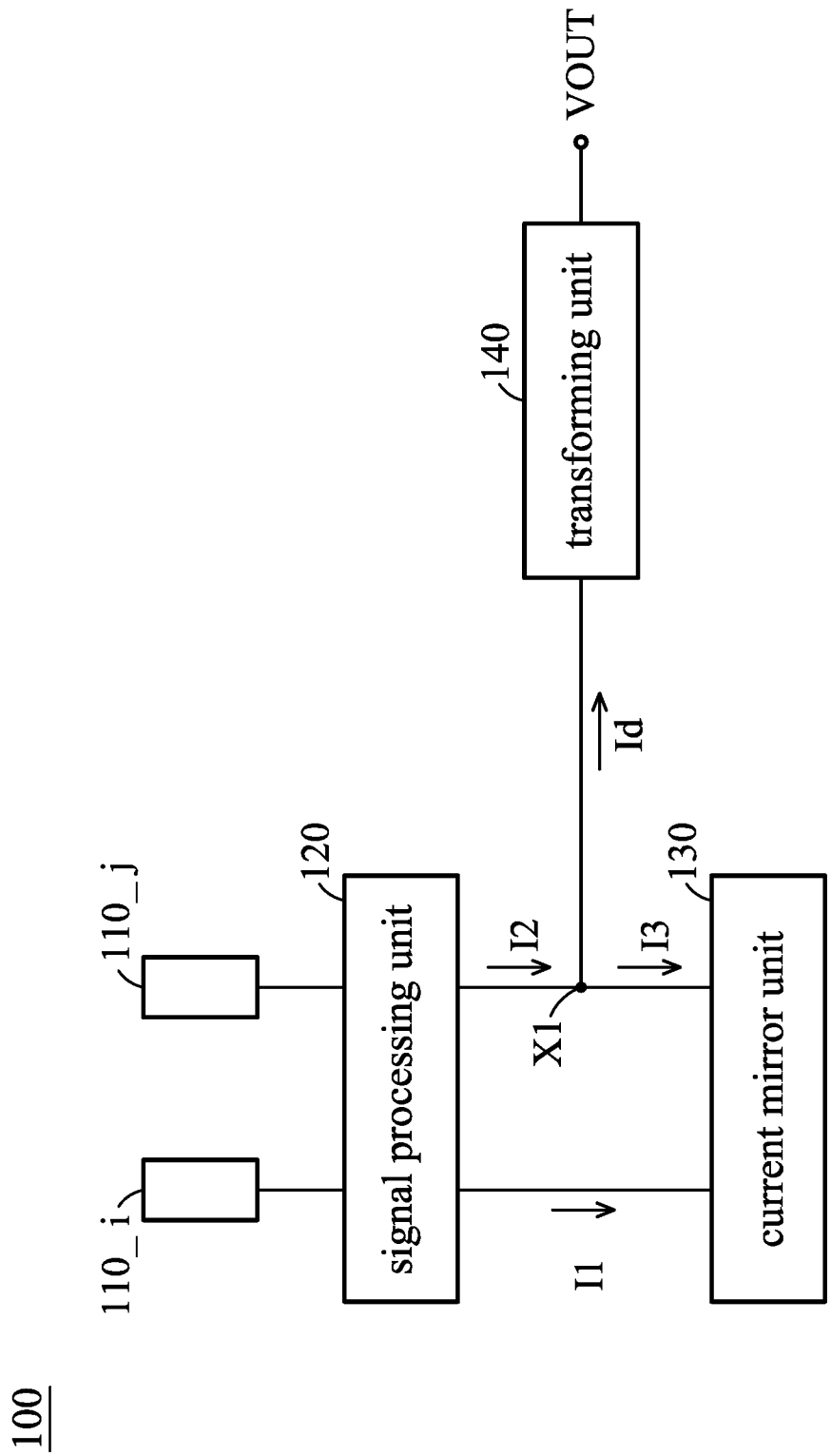
FIG. 1B is a schematic view of a processing device for position sensing according to an embodiment of the disclosure.

FIG. 1A is a schematic view of light sensors according to an embodiment of the disclosure. FIG. 1B is a schematic view of a processing device for position sensing according to an embodiment of the disclosure. Please refer to FIG. 1A and FIG. 1B. The processing device for position sensing 100 includes a plurality of light sensors 110_1~110_N, a signal processing unit 120, a current mirror unit 130 and a transforming unit 140, wherein N is a positive integer greater than 1.

The light sensors 110_1~110_N are spaced apart from each other, as shown in FIG. 1A. For example, A fixed space is between each two of the light sensors 110_1~110_N. The light sensors 110_1~110_N sense a periodic light field, so as to generate a plurality of position sensing current signals. In the embodiment, the fixed spacing is, for example, 5 um. For example, position sensing current signals may be orthogonal signals, but the disclosure in not limited thereto. The outputs related to the shifting signal is calculated and obtained according to the amplitude and phase relationship of the position sensing current signals.

In the embodiment, the light sensors 110_1~110_N may generate four position sensing current signals with a phase difference of 90 degrees. The four position sensing current signals respectively correspond to phase signals with 0 degrees, 90 degrees, 180 degrees and 270 degrees. That is, the light sensors 110_1~110_N may be divided to first group to fourth group. The light sensors of the first group correspond to 0 degrees. The light sensors of the second group correspond to 180 degrees. The light sensors of the third group correspond to 90 degrees. The light sensors of the fourth group correspond to 270 degrees.

For example, the light sensors 110_1, 110_5, 110_9, ..., 110_N−3 correspond to 0 degrees. The light sensors 110_2, 110_6, 110_10, ..., 110_N−2 correspond to 90 degrees. The light sensors 110_3, 110_7, 110_11, ..., 110_N−1 correspond to 180 degrees. The light sensors 110_4, ..., 110_8, 110_12, ..., 110_N correspond to 270 degree. That is, the light sensors 110_1, 110_2, 110_3, 110_4, ..., 110_N−1, 110_N respectively correspond to phase signals with 0 degrees, 90 degrees, 180 degrees and 270 degrees.

The light sensors corresponding to the same phase information are, for example, the light sensors 110_1, 110_5, ..., 110_N−3. The light sensors 110_1, 110_5, ..., 110_N−3 correspond to 0 degrees. The signals generated by the light sensors 110_1, 110_5, ..., 110_N−3 may be coupled together. Then, the signals above are calculated to output, so as to generate position sensing current signals with 0 degrees.

Although the signal lines of the light sensors 110_1, 110_5, ..., 110_N−3 are electrically connected together in FIG. 1A, FIG. 1A is merely a simplified schematic view. Actually, the signal lines of the light sensors 110_1, 110_5, ..., 110_N−3 may be appropriately calculated to finally generate the sense sensing current signals. Similarly, the position sense current signals with other phases may also be generated in a similar manner. In this example, the light sensors 110_i and 110_j may output two position sensing current signals, as shown in FIG. 1B. The two position sensing current signals may respectively correspond to phase signals with 0 degrees (or 90 degrees) and 180 degrees (or 270 degrees). For example, the two position sensing current signals may respectively correspond to sin (or cos) function and −sin (or −cos) function. That is, in one embodiment, the light sensors 110_i may be the first group of light sensors 110_1~110_N (corresponding to 0 degrees), and the light sensors 110_j may be the second group of light sensors 110_1~110_N (corresponding to 180 degrees). In another embodiment, the light sensors 110_i may be the third group of light sensors 110_1~110_N (corresponding to 90 degrees), and the light sensors 110_j may be the fourth group of light sensors 110_1~110_N (corresponding to 270 degrees).

In addition, the arrangement of the light sensors 110_1~110_N above is merely one exemplary embodiment of the embodiments of the disclosure, but not intended to limit the disclosure. The user may adjust the arrangement of the 110_1~110_N according to the requirement thereof, and the same effect may still be achieved. The light sensors corresponding to the same phase information are, for example, the light sensors corresponding to 0 degrees. The signals generated by the light sensors may be coupled together. Then, the signals above are calculated to output, so as to generate position sensing current signals with 0 degrees. The rest of the light sensors are similar and their operation may be discerned by analogy.

Furthermore, the light sensors 110_1~110_N are, for example, current sensors with common polarity. For example, in one embodiment, anodes (i.e., P junctions) of the light sensors 110_1~110_N may be connected together to form sensors with common P polarity current output type, or also form sensors with magnetic or other physical quantities output type. In another embodiment, cathodes (i.e., N junctions) of the light sensors 110_1~110_N may be connected together to form common N polarity current output type or also form sensors with magnetic or other physical quantities output type.

The signal processing unit 120 is coupled to the light sensors 110_i and 110_j. The signal processing unit 120 receives the position sensing current signals and provides a load isolation, so as to generate a current signal I1 and a current signal I2. That is, the signal processing unit 120 receives the position sensing current signals generated by a first group of light sensors 110_i and 110_j and the position sensing current signals generated by a second group of light sensors 110_i and 110_j to generate the current signal I1 and the current signal I2. The first group of light sensors 110_i and 110_j corresponds to the light sensors 110_i. The second group of light sensors 110_i and 110_j corresponds to the light sensors 110_j. The current signal I1 corresponds to the position sensing current signals generated by the first group. The current signal I2 corresponds to the position sensing current signals generated by the second group. In addition, the signal processing unit 120 provides the load isolation, so as to isolate the influence of the load effect, such as the internal impedance and the output load of the light sensors 110_i and 110_j. Furthermore, the signal processing unit 120 transmits the current signal I2 to a node X1.

The current mirror unit 130 is coupled to the signal processing unit 120. The current mirror unit 130 receives the first current signal and mirrors the first current signal to a current signal I3. The current mirror unit 130 transmits the current signal I3 to the node X1. In addition, the mirror current unit 130 may make the current signal I3 and the current signal I1 as the same or different according to the internal parameter setting thereof.

The transforming unit 140 is coupled to the node X1. The transforming unit 140 receives a differential current signal Id formed by the current signal I2 and the current signal I3 on the node X1. The transforming unit 140 transforms the differential current signal Id to a voltage signal VOUT. In the embodiment, the transforming unit 140 may be a transimpedance amplifier (TIA), which transforms the current signal received by the transforming unit 140 to the voltage signal VOUT.

In an entire operation of the processing device for position sensing 100, the signal processing unit 120 receives the position sensing current signals generated by the first group and the second group of light sensors 110i and 110j. The signal processing unit 120 also isolates the internal impedance and the output load of the light sensors 110i and 110j, so as to improve the injection efficiency of the signals. Then, the signal processing unit 120 may generate the current signal I1 and the current signal I2. The current signal I1 corresponds to the first group of light sensors 110i and 110j. The current signal I2 corresponds to the second group of light sensors 110i and 110j. The signal processing unit 120 transmits the current signal to the node X1.

Then, the current mirror unit 130 receives the current signal I1 and mirrors the current signal I1 to a current signal I3. The current signal I3 is outputted to the node X1. In the embodiment, the current signal I1 may be the same as the current signal I3. Afterward, the current signal I2 and the current signal I3 may form a differential eliminating effect on the node X1, so as to generate the differential current signal Id, thereby effectively eliminating a common-mode signal of the current signal on the node X1. The common-mode signal includes components, such as a common-mode interference and a direct current. Therefore, the processing unit for position sensing 100 may achieve a sensing structure with current differential current. For example, the processing unit for position sensing achieves a sensing effect that is the same as a balanced detector.

Then, the transforming unit 140 transforms the differential current signal Id formed by the current signal I2 and the current signal I3 on the node X1 to the voltage signal VOUT. Therefore, the influence of the internal impendence and the output load of the light sensors 110_i and 110_j may be effectively decreased and a bandwidth limitation of the transforming unit 140 may also be reduced. In addition, the injection efficiency of the current signal is improved and an operation bandwidth of the transforming unit 140 is increased.

Figure 2A:
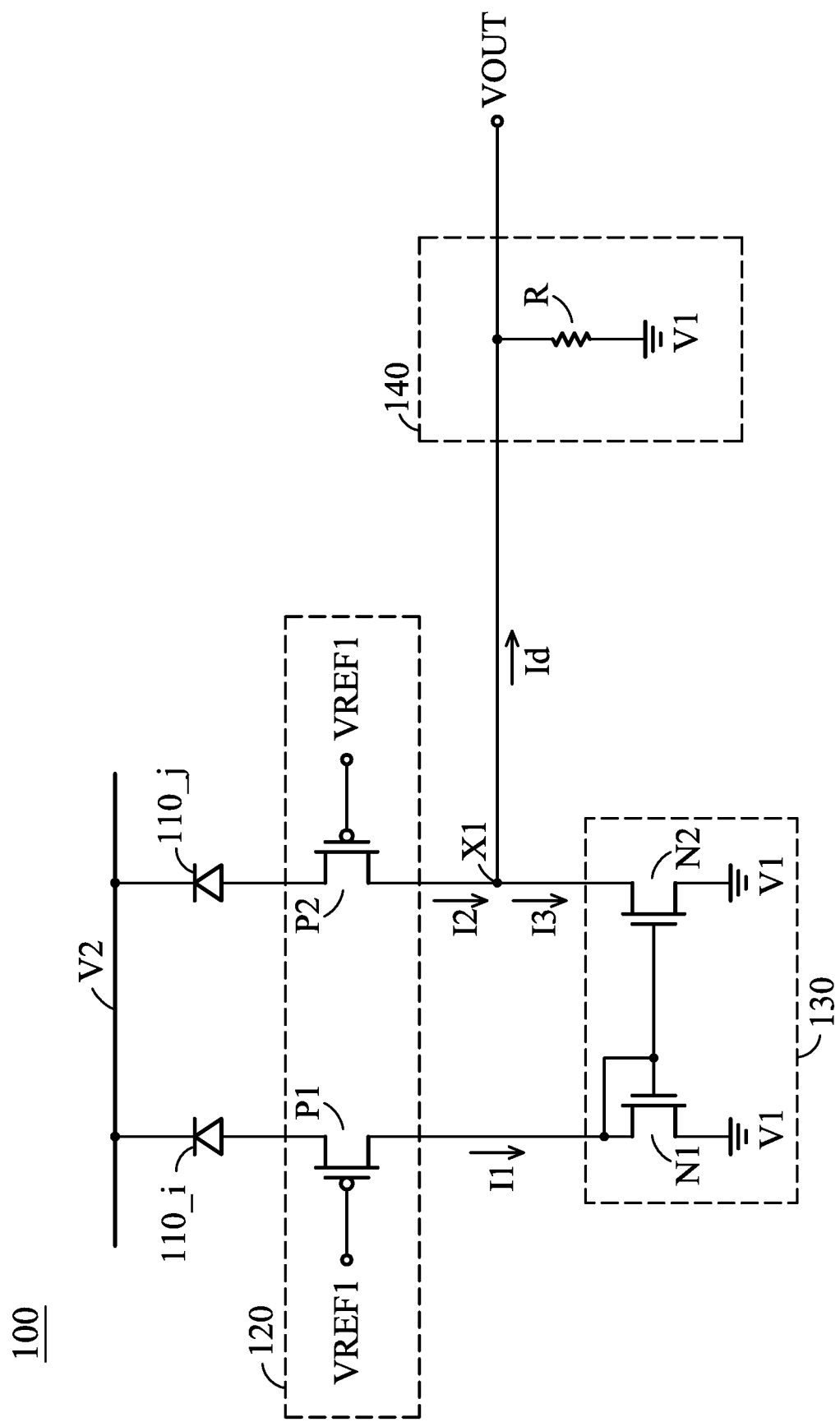
FIG. 2A is a detailed schematic view of the processing device for position sensing in FIG. 1B.

FIG. 2A is a detailed schematic view of the processing device for position sensing in FIG. 1B. In the embodiment, the light sensors 110_i and 110_j are current sensor with common P polarity. That is, anodes (i.e., P junctions) of the light sensors 110_i and 110_j are connected together. In addition, the anodes of the light sensors 110_i and 110_j may be connected to a voltage V2, such as a working voltage.

The signal processing unit 120 includes transistors P1 and P2. In the embodiment, the transistors P1 and P2 are, for example, P-type transistors. The transistor P1 has a first terminal (such as a gate terminal), a second terminal (such as a drain terminal) and a third terminal (such as a source terminal). The first terminal of the transistor P1 receives a reference voltage VREF1. The second terminal of the transistor P1 is coupled to the current mirror unit 130 and generates the current signal I1. The third terminal of the transistor P1 is coupled to the first group of light sensors 110_i and 110_j, such as the light sensors 110i.

The transistor P2 has a first terminal (such as a gate terminal), a second terminal (such as a drain terminal) and a third terminal (such as a source terminal). The first terminal of the transistor P2 receives the reference voltage VREF1. The second terminal of the transistor P2 is coupled to the node X1 and generates the current signal I2. The third terminal of the transistor P2 is coupled to the second group of light sensors 110_i and 110_j, such as the light sensors 110_j. In the embodiment, the first terminal of the transistor P1 and the first terminal of the transistor P2 receive the reference voltage VREF1, so that the transistor P1 and the transistor P2 form transistors with common polarity (such as common gate polarity).

In addition, the transistor P1 and the transistor P2 may respectively serve as a direct injection (DI) circuit. The transistor P1 and the transistor P2 are operated in a saturation region by controlling the reference voltage VREF1, i.e., controlling gate-source voltage Vgs of the transistor P1 and the transistor P2. Accordingly, the output resistances of the transistor P1 and the transistor P2 are very large, so as to effectively isolate the impendence property and the resistance property of the light sensors 110i and the light sensors 110j and increase the injection efficiency of the current. In addition, the signal processing unit 120 adopts P-type transistors P1 and P2, it may also reduce a low-frequency flicker noise in position sensing current signals.

The current mirror 130 includes transistors N1 and N2. In the embodiment, the transistors N1 and N2 are, for example, N-Type transistors. The transistor N1 has a first terminal (such as a gate terminal), a second terminal (such as a drain terminal) and a third terminal (such as a source terminal). The first terminal and the second terminal of the transistor N1 are coupled to the second terminal of the transistor P1. The third terminal of the transistor N1 is coupled to a voltage V1. In the embodiment, the voltage V1 is, for example, a ground voltage.

The transistor N2 has a first terminal (such as a gate terminal), a second terminal (such as a drain terminal) and a third terminal (such as a source terminal). The first terminal of the transistor N2 is coupled to the first terminal of the transistor N1. The second terminal of the transistor N2 is coupled to the node X1 and generates the current signal I3. The third terminal of the transistor N2 is coupled to the voltage V1. In the embodiment, the first terminal of the transistor N2 is coupled to the first terminal of the transistor N1, so that the transistor N2 and the transistor N1 also form transistors with common polarity (such as common gate polarity).

The transforming unit 140 includes a resistor R. The resistor R has a first terminal and a second terminal. The first terminal of the resistor R is coupled to the node X1 and outputs the voltage signal VOUT. The second terminal of the resistor R is coupled to the voltage V1.

Figure 2B:
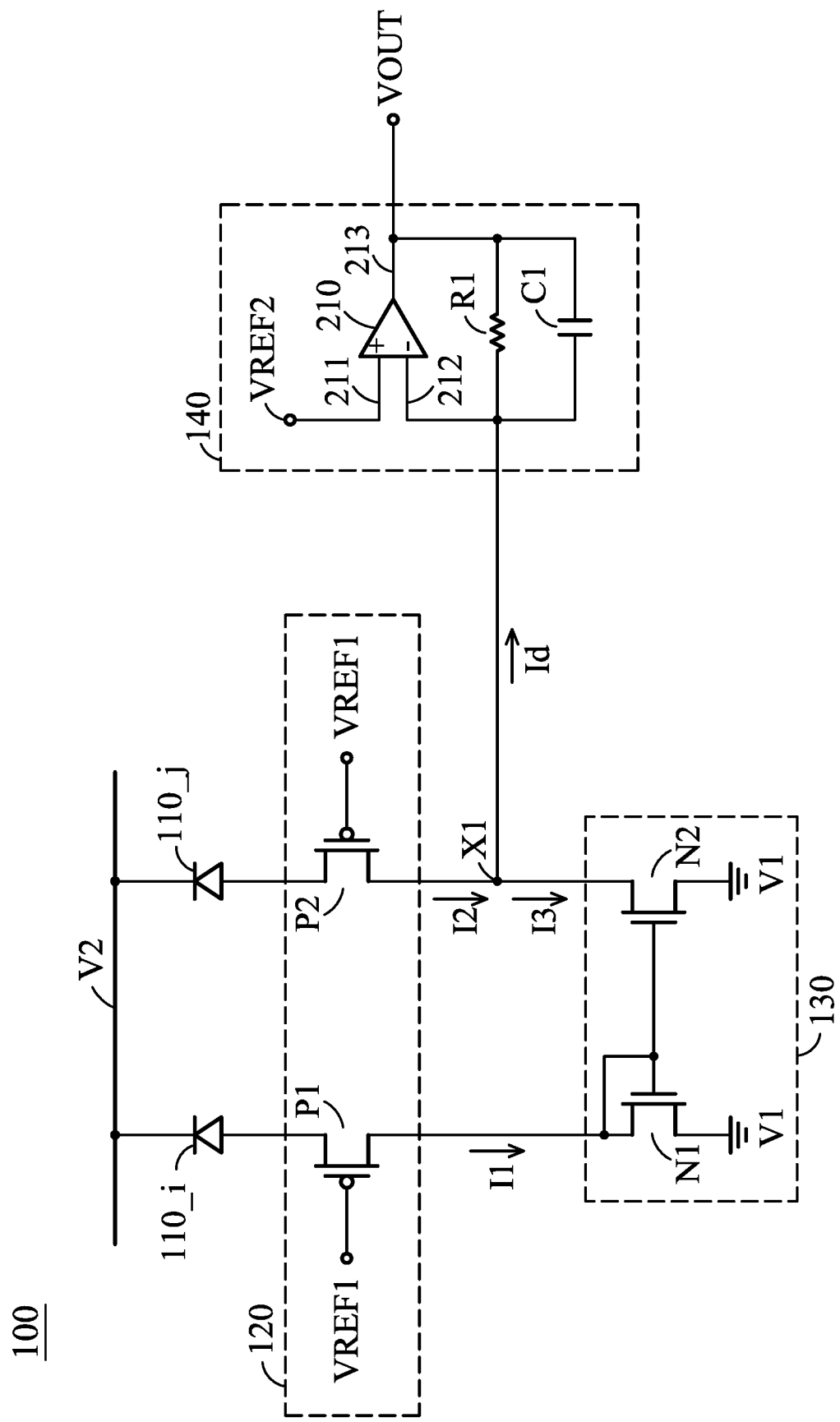
FIG. 2B is another detailed schematic view of the processing device for position sensing in FIG. 1B.

FIG. 2B is another detailed schematic view of the processing device for position sensing in FIG. 1B. The processing unit for position sensing 100 in FIG. 2B is substantially the same as the processing unit for position sensing 100 in FIG. 2A. In the embodiment, the transforming unit 140 includes a buffer unit 210, a resistor R1 and a capacitor C1. The buffer unit 210 is, for example, an operational amplifier (OPAMP). The buffer unit 210 has a first input terminal (such as a positive input terminal) 211, a second input terminal (such as a negative input terminal) 212 and an output terminal 213. The first input terminal 211 of the buffer unit 210 receives a reference voltage VREF2. The second input terminal 212 of the buffer unit 210 is coupled to the node X1. The output terminal 213 of the buffer unit 210 outputs the voltage signal VOUT.

The resistor R1 has a first terminal and a second terminal. The first terminal of the resistor R1 is coupled to the second input terminal 212 of the buffer unit 210. The second terminal of the resistor R1 is coupled to the output terminal 213 of the buffer unit 210. The capacitor C1 has a first terminal and a second terminal. The first terminal of the capacitor C1 is coupled to the first terminal of the resistor R1. The second terminal of the capacitor C1 is coupled to the second terminal of the resistor R1. That is, the resistor R1 and the capacitor C1 are coupled in parallel.

Figure 3A:
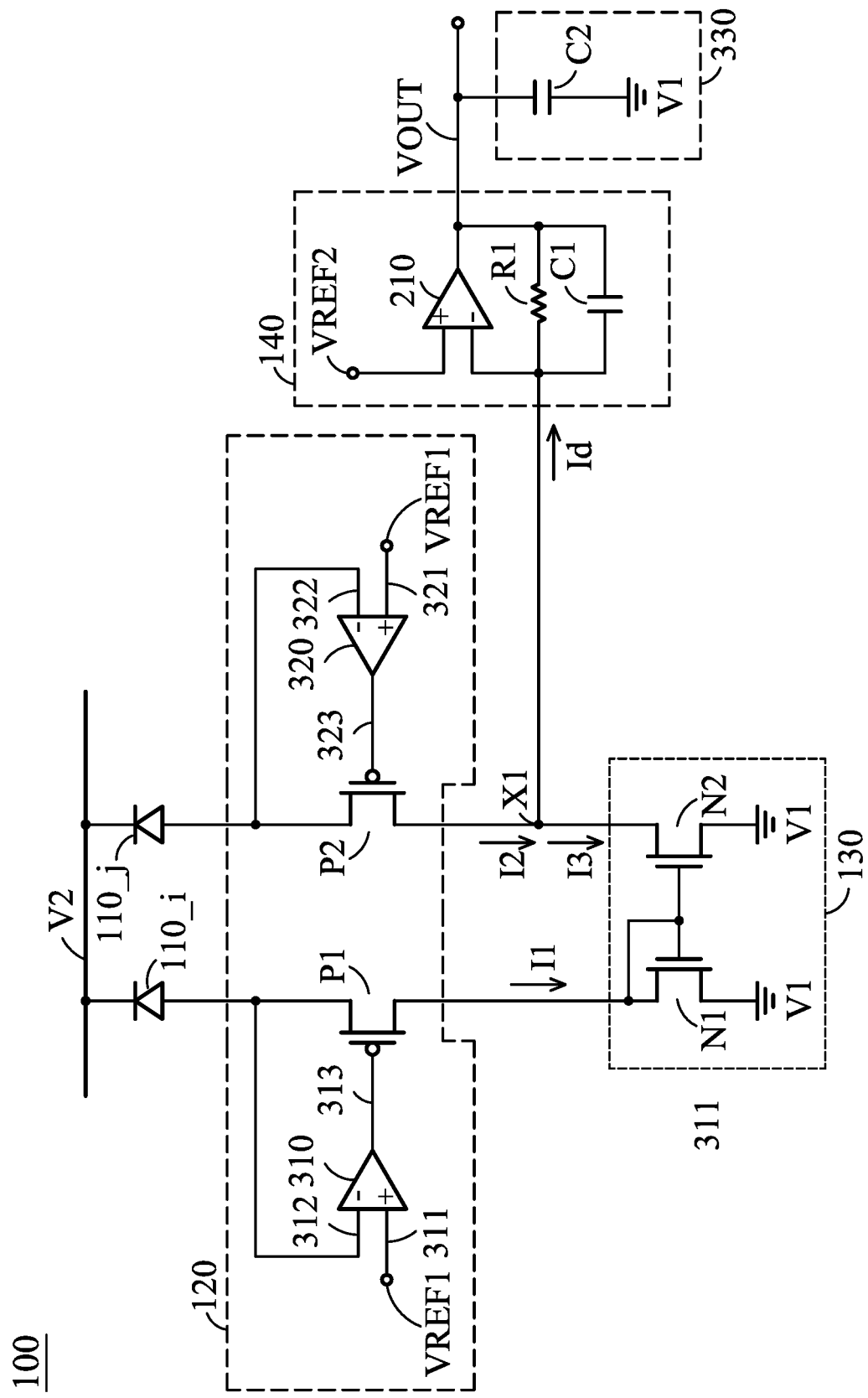
FIG. 3A is another detailed schematic view of the processing device for position sensing in FIG. 1B.
Figure 3B:
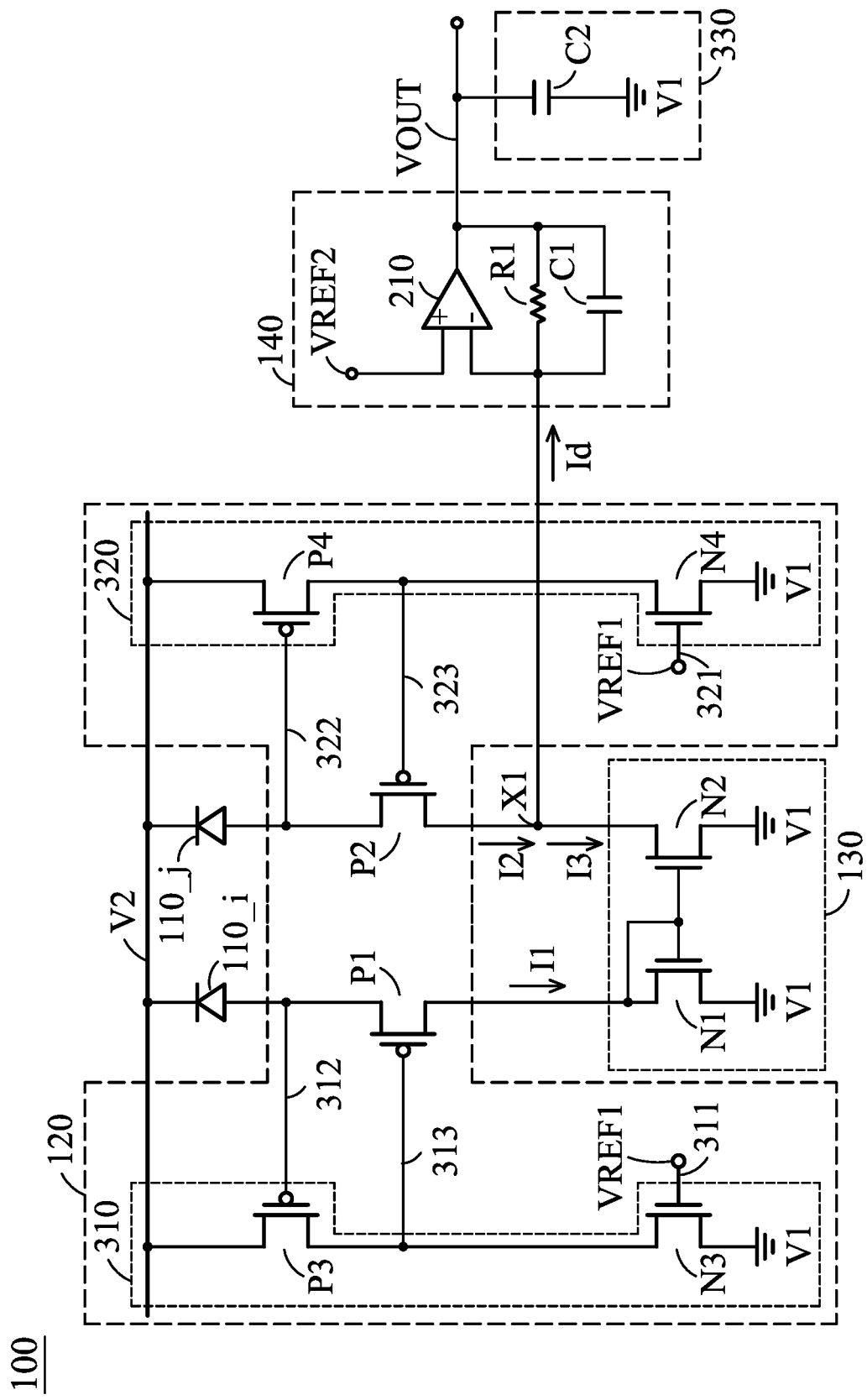
FIG. 3B is a detailed schematic view of FIG. 3A.

FIG. 3A is another detailed schematic view of the processing device for position sensing in FIG. 1B. FIG. 3B is a detailed schematic view of FIG. 3A. The processing unit for position sensing 100 in FIGS. 3A and 3B are substantially the same as the processing unit for position sensing 100 in FIG. 2B. The difference between FIGS. 3A and 3B and FIG. 2B is that the signal processing unit 120 in FIGS. 3A and 3B further includes a buffer unit 310 and a buffer unit 320. In the embodiment, the buffer unit 310 and the buffer unit 320 are, for example, operation amplifiers.

The buffer unit 310 is coupled between the first terminal of the transistor P1 and the reference voltage VREF1. The buffer unit 310 has a first input terminal 311 (for example, served as a positive input terminal), a second input terminal 312 (for example, served as a negative input terminal) and an output terminal 313. The first input terminal 311 of the buffer unit 310 receives the reference voltage VREF1. The second input terminal 312 of the buffer unit 310 is coupled to the third terminal of the transistor P1. The output terminal 313 of the first buffer unit 310 is coupled to the first terminal of the transistor P1.

The buffer unit 320 is coupled between the first terminal of the transistor P2 and the reference voltage VREF1. The buffer unit 320 has a first input terminal 321 (for example, served as a positive input terminal), a second input terminal 322 (for example, served as a negative input terminal) and an output terminal 323. The first input terminal 321 of the buffer unit 320 receives the reference voltage VREF1. The second input terminal 312 of the buffer unit 320 is coupled to the third terminal of the transistor P2. The output terminal 323 of the buffer unit 320 is coupled to the first terminal of the transistor P2.

In addition, the buffer unit 310 and transistor P1 may serve as a buffer direct injection (BDI) circuit. The buffer unit 320 and transistor P2 may also serve as the buffer direct injection circuit. Compared to FIG. 2B, the buffer unit 310 and the buffer unit 320 are added in each of the embodiments in FIGS. 3A and 3B, so that the buffer property of the signal processing unit 120 may be improved. The buffer unit 310 and the buffer 320 may also have negative feedback properties, the control efficiency and the gain of the voltage may be improved and the injection efficiency and the stability of the signal may also be improved.

Furthermore, the buffer unit 310 includes transistors N3 and P3. In the embodiment, the transistor N3 is, for example, a N-type transistor and the transistor P3 is, for example, a P-type transistor. The transistor N3 has a first terminal (such as a gate terminal), a second terminal (such as a drain terminal) and a third terminal (such as a source terminal). The first terminal of the transistor N3 serves as the first input terminal 311 of the first buffer unit 310. The second terminal of the transistor N3 serves as the output terminal 313 of the buffer unit 310. The third terminal of the transistor N3 is coupled to a voltage V1 (such as a ground voltage).

The transistor P3 has a first terminal (such as a gate terminal), a second terminal (such as a drain terminal) and a third terminal (such as a source terminal). The first terminal of the transistor P3 serves as the second input terminal 312 of the buffer unit 310. The second terminal of the transistor P3 is coupled to the second terminal of the transistor N3. The third terminal of the transistor P3 is coupled to a voltage V2 (such as a working voltage).

The buffer 320 includes transistors N4 and P4. In the embodiment, the transistor N4 is, for example, an N-type transistor and the transistor P4 is, for example, a P-type transistor. The transistor N4 has a first terminal (such as a gate terminal), a second terminal (such as a drain terminal) and a third terminal (such as a source terminal). The first terminal of the transistor N4 serves as the first input terminal 321 of the buffer unit 320. The second terminal of the transistor N4 serves as the output terminal 323 of the buffer unit 320. The third terminal of the transistor N4 is coupled to the voltage V1 (such as the ground voltage).

The transistor P4 has a first terminal (such as a gate terminal), a second terminal (such as a drain terminal) and a third terminal (such as a source terminal). The first terminal of the transistor P4 serves as the second input terminal 322 of the buffer unit 320. The second terminal of the transistor P4 is coupled to the second terminal of the transistor N4. The third terminal of the transistor P4 is coupled to the voltage (such as the working voltage).

Furthermore, the processing device for position sensing 100 further includes an energy storage unit 330. The energy storage unit 330 is coupled to the transforming unit 140. The energy storage unit 330 receives the voltage signal VOUT to generate an energy storage signal. In the embodiment, the energy storage unit includes a capacitor C2. The capacitor C2 is coupled between the transforming unit 140 and the voltage V1 (such as the ground voltage). In addition, the signal processing unit 120 adopts the P-type transistors P1 and P2, so that the signal processing unit 120 may reduce a low-frequency flicker noise in the current signal for position sensing.

Figure 4:
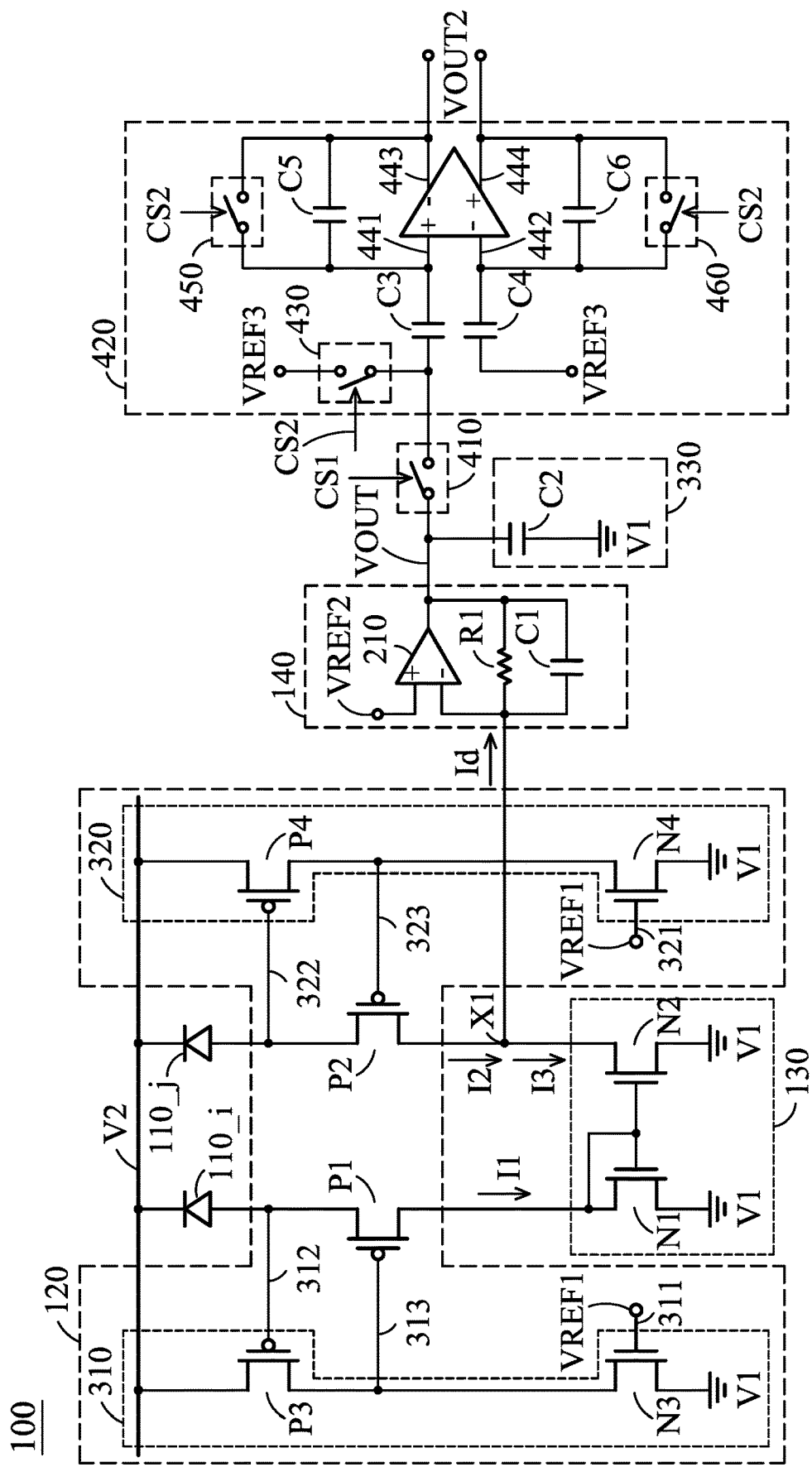
FIG. 4 is another detailed schematic view of the processing device for position sensing in FIG. 1B.

FIG. 4 is another detailed schematic view of the processing device for position sensing in FIG. 1B. The processing unit for position sensing 100 in FIG. 4 is substantially the same as the processing unit for position sensing 100 in FIGS. 3A and 3B. The difference between the FIG. 4 and FIGS. 3A and 3B is that the processing unit for position sensing 100 in FIG. 4 further includes a switch unit 410 and a buffer unit 420. In the embodiment, the buffer unit 420 is, for example, an operation amplifier.

The switch unit 410 is coupled to the energy storage unit 330 and controlled by a control signal CS1. That is, the switch unit 410 may be turned on or off according a level of the control signal CS1. The buffer unit 420 is coupled to the switch unit 410. When the switch unit 410 is turned on, the buffer unit 420 buffers the energy storage signal of the energy storage unit 330 to provide an output signal VOUT2.

Furthermore, the buffer unit includes a switch unit 430, a capacitor C3, a capacitor C4, an amplifier 440, a capacitor C5, a switch unit 450, a capacitor C6 and a switch unit 460. The switch unit 430 is coupled to the switch unit 410 and a reference voltage VREF3. The switch unit 430 is controlled by a control signal CS2. That is, the switch unit 430 may be turned on or off according to a level of the control signal CS2. The capacitor C3 has a first terminal and a second terminal. The first terminal of the capacitor C1 is coupled to the switch unit 430. The capacitor C4 has a first terminal and a second terminal. The first terminal of the capacitor C4 receives the reference voltage VREF3.

The amplifier 440 has a first input terminal 441 (for example, served as a positive input terminal), a second input terminal 442 (for example, served as a negative input terminal), a first output terminal 443 (such as a negative output terminal) and a second output terminal 444 (for example, served as a positive output terminal). The first input terminal 441 of the amplifier 440 is coupled to the second terminal of the capacitor C3. The second input terminal 442 of the amplifier 440 is coupled to the second terminal of the capacitor C4. The first output terminal 443 and the second output terminal 444 of the amplifier 440 provide the output signal VOUT2, such as a differential output signal. In the embodiment, the amplifier 440 is, for example, an operation amplifier.

The capacitor C5 has a first terminal and a second terminal. The first terminal of the capacitor C5 is coupled to the first terminal 441 of the amplifier 440. The second terminal of the capacitor C5 is coupled to first output terminal 443 of the amplifier 440. The switch unit 450 is coupled to the capacitor C5 in parallel. The switch unit 450 is controlled by the control signal CS2. That is, the switch unit 450 may be turned on or off according to the level of the control signal CS2.

The capacitor C6 having a first terminal and a second terminal. The first terminal of the capacitor C6 is coupled to the second input terminal 442 of the amplifier 440. The second terminal of the capacitor C6 is coupled to the second output terminal 444 of the amplifier 440. The switch unit 460 is coupled to the capacitor C6 in parallel. The switch unit 460 is controlled by the control signal C2. That is, the switch unit 460 may be turned on or off according to the level of the control signal C2. In the embodiment, the first control signal is complementary to the second control signal. That is, when the control signal CS1 is a high logic level, the control signal CS2 is a low logic level. On the contrary, when the control signal CS1 is a low logic level, the control signal CS2 is a high logic level.

For example, when the control signal CS1 is the low logic level and the control signal CS2 is the high logic level, the switch unit 410 is turned off, so that the energy storage unit 330 is charged by using the output voltage VOUT of the transforming unit 140, so as to generate the energy storage signal. At the same time, the switch units 430, 450 and 460 are turned on, so that the buffer unit 420 may provide the output signal VOUT2 according to the reference voltage VREF3. When the control signal CS1 is the high logic level and the control signal CS2 is the low logic level, the switch unit 410 is turned on, so that the energy storage unit 330 outputs the energy storage signal to the buffer unit 420. At the same time, the switch units 430, 450 and 460 are turned off, so that buffer unit 420 performs an integration and amplification processing according to the reference voltage VREF3 and the energy storage signal, so as to provide the output signal VOUT2.

Figure 5A:
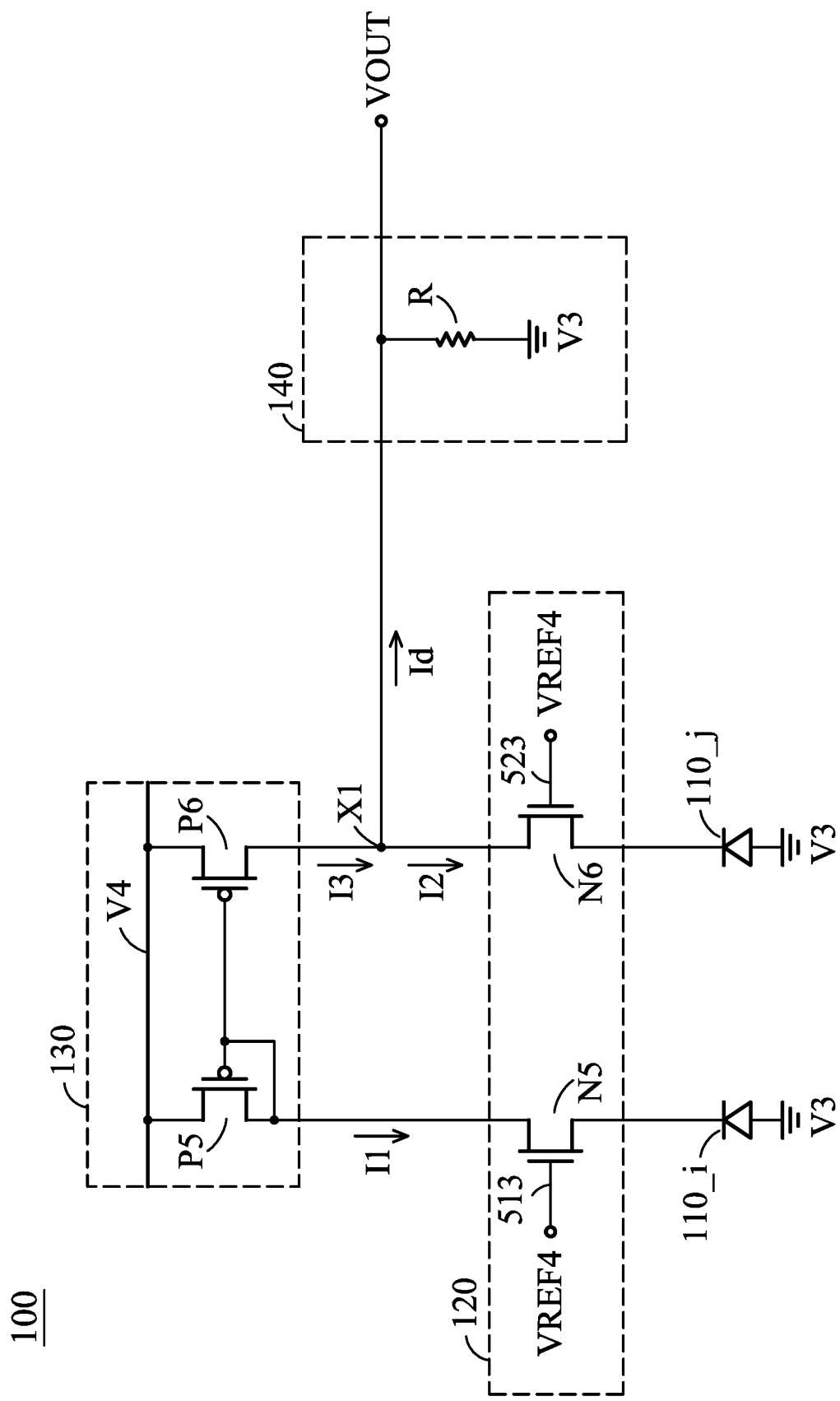
FIG. 5A is another detailed schematic view of the processing device for position sensing in FIG. 1B.

FIG. 5A is another detailed schematic view of the processing device for position sensing in FIG. 1B. In the embodiment, the light sensors 110_i and 110_j are current sensor with common N polarity. That is, cathodes (i.e., N junctions) of the light sensors 110_i and 110_j are connected together. In addition, the anodes of the light sensors 110_i and 110_j may be connected to a voltage V3, such as a ground voltage.

The signal processing unit 120 includes transistors N5 and N6. In the embodiment, the transistors N5 and N6 are, for example, N-type transistors. The transistor N5 has a first terminal (such as a gate terminal), a second terminal (such as a drain terminal) and a third terminal (such as a source terminal). The first terminal of the transistor N5 receives a reference voltage VREF4. The second terminal of the transistor N5 is coupled to the current mirror unit 130 and generates the current signal I1. The third terminal of the transistor N5 is coupled to the first group of light sensors 110_i and 110_j, such as the light sensors 110i.

The transistor N6 has a first terminal (such as a gate terminal), a second terminal (such as a drain terminal) and a third terminal (such as a source terminal). The first terminal of the transistor N6 receives the reference voltage VREF1. The second terminal of the transistor N6 is coupled to the node X1 and generates the current signal I2. The third terminal of the transistor N6 is coupled to the second group of light sensors 110_i and 110_j, such as the light sensors 110_j. In the embodiment, the first terminal of the transistor N5 and the first terminal of the transistor N6 receive the reference voltage VREF4, so that the transistor N5 and the transistor N6 form transistors with common polarity (such as common gate polarity).

In addition, the transistor N5 and the transistor N6 may respectively serve as a direct injection circuit. The transistor N5 and the transistor N6 are operated in a saturation region by controlling the reference voltage VREF4, i.e., controlling gate-source voltage Vgs of the transistor N5 and the transistor N6. Accordingly, the output resistances of the transistor N5 and the transistor N6 are very large, so as to effectively isolate the impendence property and the resistance property of the light sensors 110i and the light sensors 110j and increase the injection efficiency of the current.

The current mirror unit 130 includes transistors P5 and P6. In the embodiment, the transistors P5 and P6 are, for example, P-type transistors. The transistor P5 has a first terminal (such as a gate terminal), a second terminal (such as a drain terminal) and a third terminal (such as a source terminal). The first terminal and the second terminal of the transistor P5 are coupled to the second terminal of the transistor N5. The third terminal of the transistor P5 is coupled to a voltage V4. In the embodiment, the voltage V4 is, for example, a working voltage.

The transistor P6 has a first terminal (such as a gate terminal), a second terminal (such as a drain terminal) and a third terminal (such as a source terminal). The first terminal of the transistor P6 is coupled to the first terminal of the transistor P5. The second terminal of the transistor P6 is coupled to the node X1 and generates the current signal I3. The third terminal of the transistor P6 is coupled to the voltage V4 (such as the working voltage). In the embodiment, the first terminal of the transistor P6 is coupled to the first terminal of the transistor P5, so that the transistor P6 and the transistor P5 also form transistors with common polarity (such as common gate polarity).

The transforming unit 140 includes a resistor R. The coupling relationship of the resistor R is the same as or similar to the coupling relationship of the resistor R in FIG. 2A. The coupling relationship of the resistor R may refer to the description of the embodiment in FIG. 2A and the description thereof is not repeated herein.

Figure 5B:
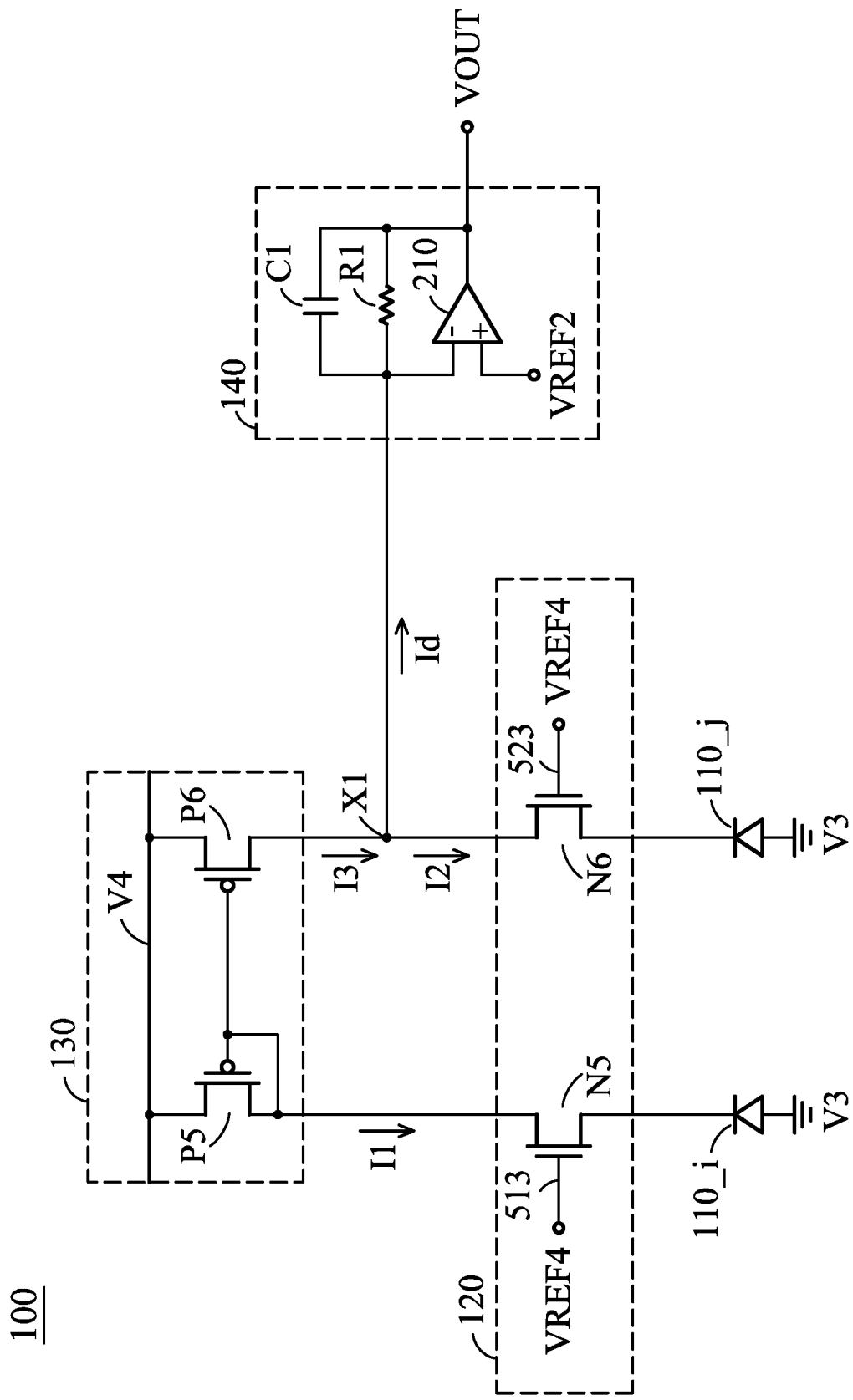
FIG. 5B is another detailed schematic view of the processing device for position sensing in FIG. 1B.

FIG. 5B is another detailed schematic view of the processing device for position sensing in FIG. 1B. The processing unit for position sensing 100 in FIG. 5B is substantially the same as the processing unit for position sensing 100 in FIG. 5A. The transforming unit 140 includes a buffer unit 210, a resistor R1 and a capacitor C1. The coupling relationships of the buffer unit 210, the resistor R1 and the capacitor C1 are the same as or similar to the coupling relationships of the buffer unit 210, the resistor R1 and the capacitor C1 in FIG. 2B. The coupling relationships of the buffer unit 210, the resistor R1 and the capacitor C1 may refer to the descriptions of the embodiment in FIG. 2B and the descriptions thereof is not repeated herein.

Figure 6A:
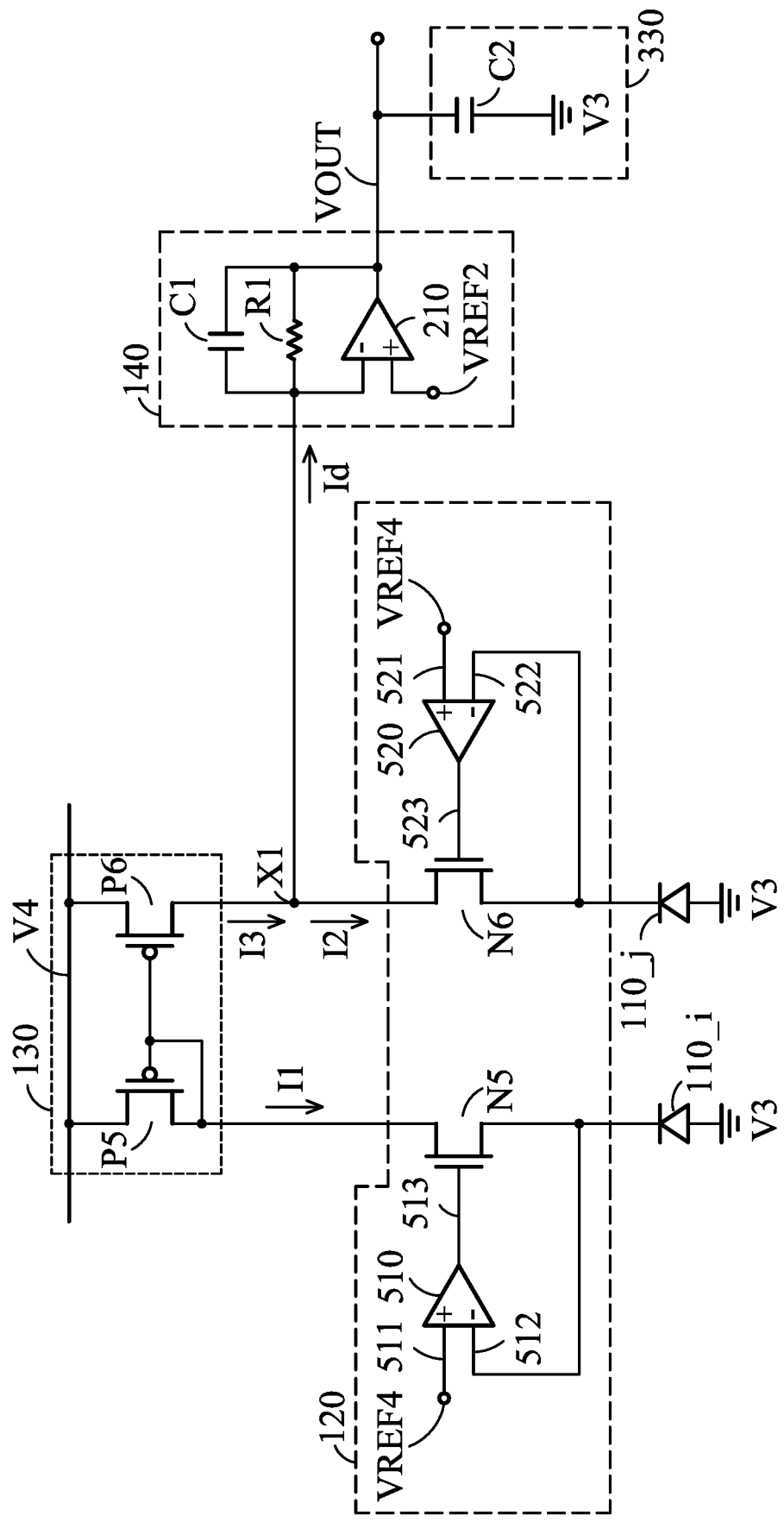
FIG. 6A is another detailed schematic view of the processing device for position sensing in FIG. 1B.
Figure 6B:
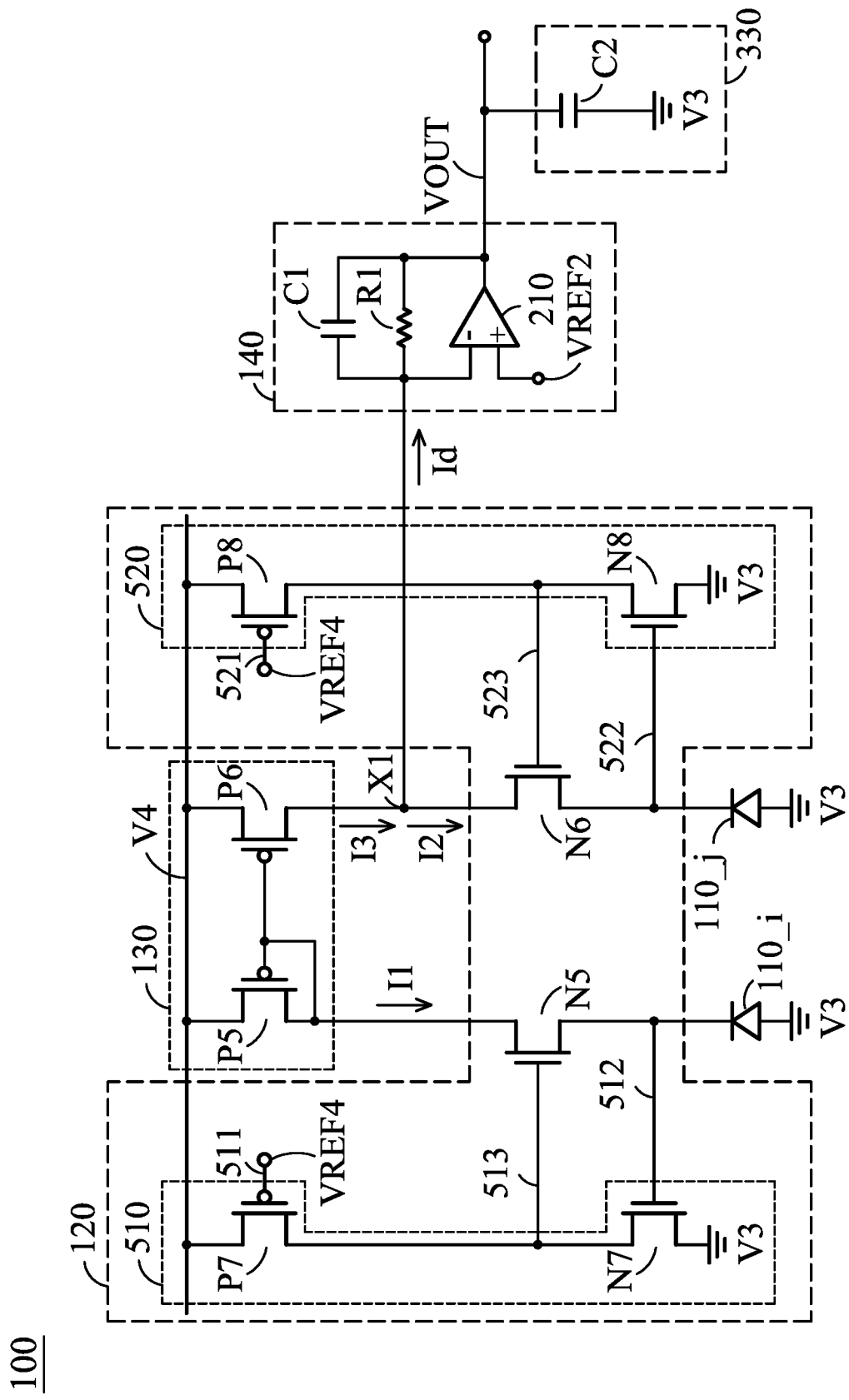
FIG. 6B is a detailed schematic view of FIG. 6A.

FIG. 6A is another detailed schematic view of the processing device for position sensing in FIG. 1B. FIG. 6B is a detailed schematic view of FIG. 6A. The processing unit for position sensing 100 in FIGS. 6A and 6B is substantially the same as the processing unit for position sensing 100 in FIG. 5B. The difference between FIGS. 6A and 6B and FIG. 5B is that the signal processing unit 120 in FIGS. 6A and 6B further includes a buffer unit 510 and a buffer unit 520. In the embodiment, the buffer unit 510 and the buffer unit 520 are, for example, operation amplifiers.

The buffer unit 510 is coupled between the first terminal of the transistor N5 and the reference voltage VREF4. The buffer unit 510 has a first input terminal 511 (for example, served as a positive input terminal), a second input terminal 512 (for example, served as a negative input terminal) and an output terminal 513. The first input terminal 511 of the buffer unit 510 receives the reference voltage VREF4. The second input terminal 512 of the buffer unit 510 is coupled to the third terminal of the transistor N5. The output terminal 513 of the first buffer unit 510 is coupled to the first terminal of the transistor N5.

The buffer unit 520 is coupled between the first terminal of the transistor N6 and the reference voltage VREF4. The buffer unit 520 has a first input terminal 521 (for example, served as a positive input terminal), a second input terminal 522 (for example, served as a negative input terminal) and an output terminal 523. The first input terminal 521 of the buffer unit 520 receives the reference voltage VREF4. The second input terminal 512 of the buffer unit 520 is coupled to the third terminal of the transistor N6. The output terminal 523 of the buffer unit 520 is coupled to the first terminal of the transistor N6.

In addition, the buffer unit 510 and transistor N5 may serve as a buffer direct injection circuit. The buffer unit 520 and transistor N6 may also serve as the buffer direct injection circuit. Compared to FIG. 5B, the buffer unit 510 and the buffer unit 520 are added in each of the embodiments in FIGS. 6A and 6B, so that the buffer property of the signal processing unit 120 may be improved. The buffer unit 510 and the buffer 520 may also have negative feedback properties, the control efficiency and the gain of the voltage may be improved and the injection efficiency and the stability of the signal may also be improved.

Furthermore, the buffer unit 510 includes transistors P7 and N7. In the embodiment, the transistor P7 is, for example, a P-type transistor and the transistor N7 is, for example, an N-type transistor.

The transistor P7 has a first terminal (such as a gate terminal), a second terminal (such as a drain terminal) and a third terminal (such as a source terminal). The first terminal of the transistor P7 serves as the first input terminal 511 of the first buffer unit 510. The second terminal of the transistor P7 serves as the output terminal 513 of the buffer unit 510. The third terminal of the transistor P7 is coupled to the voltage V4 (such as the working voltage).

The transistor N7 has a first terminal (such as a gate terminal), a second terminal (such as a drain terminal) and a third terminal (such as a source terminal). The first terminal of the transistor N7 serves as the second input terminal 512 of the buffer unit 510. The second terminal of the transistor N7 is coupled to the second terminal of the transistor P7. The third terminal of the transistor N7 is coupled to a voltage V3 (such as a ground voltage).

The buffer unit 520 includes transistors P8 and N8. In the embodiment, the transistor P8 is, for example, a P-type transistor. The transistor N8 is, for example, an N-type transistor.

The transistor P8 has a first terminal (such as a gate terminal), a second terminal (such as a drain terminal) and a third terminal (such as a source terminal). The first terminal of the transistor P8 serves as the first input terminal 521 of the buffer unit 520. The second terminal of the transistor P8 serves as the output terminal 523 of the second buffer unit 520. The third terminal of the transistor P8 is coupled to the voltage V4 (such as the working voltage).

The transistor N8 has a first terminal (such as a gate terminal), a second terminal (such as a drain terminal) and a third terminal (such as a source terminal). The first terminal of the transistor N8 serves as the second input terminal 522 of the buffer unit 520. The second terminal of the transistor N8 is coupled to the second terminal of the transistor P8. The third terminal of the transistor N8 is coupled to the voltage V3 (such as the ground voltage).

Furthermore, the processing unit for position sensing 100 further includes a storage unit 330. In the embodiments, the internal elements and the coupling relationship thereof of the storage unit 330 are the same as or similar to that of the storage unit 330 in FIGS. 3A and 3B. The description thereof will be the same as that of the embodiments in FIGS. 3A and 3B and it is not repeated herein.

Figure 7:
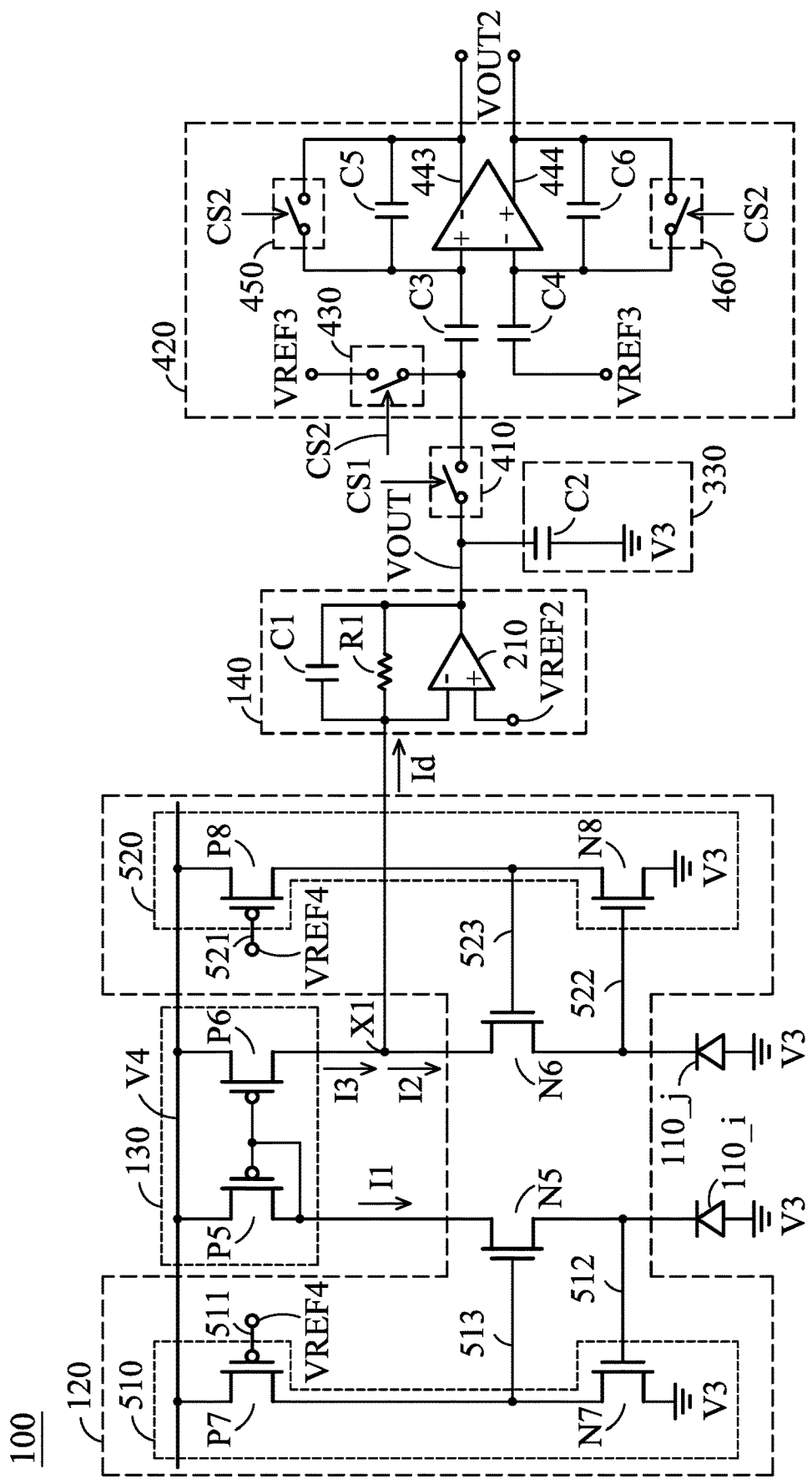
FIG. 7 is another detailed schematic view of the processing device for position sensing in FIG. 1B.

FIG. 7 is another detailed schematic view of the processing device for position sensing in FIG. 1B. The processing unit for position sensing 100 in FIG. 7 is substantially the same as the processing unit for position sensing 100 in FIGS. 6A and 6B. The difference between the FIG. 7 and FIGS. 6A and 6B is that the processing unit for position sensing 100 in FIG. 7 further includes a switch unit 410 and a buffer unit 420.

In the embodiments, the internal elements and the coupling relationships thereof of the switch unit 410 and the buffer unit 420 are the same as or similar to that of the switch unit 410 and the buffer unit 420 in FIG. 4. The description thereof will be the same as that of the embodiments in FIG. 4 and it is not repeated herein.

In summary, according to the processing device for position sensing, the signal processing unit receives the position sensing current signals generated by the light sensors and provides the load isolation, so as to generate the first current signal and the second current signal. The current mirror mirrors the first current signal to the third current signal. The second current signal and the third current signal form the differential eliminating effect on the node to eliminate the common-mode signal (such as common-mode direct current and the common-mode noise) of the current signal, so as to generate the differential current signal. The transforming unit receives the differential current signal and transforms the differential current signal to the voltage signal. Therefore, the influence of the internal impendence and the output load of the light sensors may be effectively decreased and the bandwidth limitation of the transforming unit may also be reduced. In addition, the injection efficiency of the current signal is improved and an operation bandwidth of the transforming unit is increased.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A processing device for position sensing, comprising:
    a plurality of light sensors, wherein the light sensors are spaced apart from each other and sense a light field to generate a plurality of position sensing current signals;
    a signal processing unit, coupled to the light sensors, receiving the position sensing current signals and providing a load isolation, so as to generate a first current signal and a second current signal, wherein the second current signal is transmitted to a node, the first current signal corresponds to the position sensing current signals of a first group of light sensors and the second current signal corresponds to the position sensing current signals of a second group of light sensors;
    a current mirror unit, coupled to the signal processing unit, receiving the first current signal and mirroring the first current signal to a third current signal, wherein the third current signal is transmitted to the node; and
    a transforming unit, coupled to the node, receiving a differential current signal formed by the second current signal and the third current signal on the node, and transforming the differential current signal to a voltage signal.

2. The processing device for position sensing as claimed in claim 1, wherein the light sensors form sensors with a common polarity current output type.

3. The processing device for position sensing as claimed in claim 1, wherein the signal processing unit comprises:
    a first transistor, having a first terminal, a second terminal and a third terminal, wherein the first terminal of the first transistor receives a reference voltage, the second terminal of the first transistor is coupled to the current mirror unit and generates the first current signal, and the third terminal of the first transistor is coupled to the first group of light sensors; and a second transistor, having a first terminal, a second terminal and a third terminal, wherein the first terminal of the second transistor receives the reference voltage, the second terminal of the second transistor is coupled to the node and generates the second current signal, and the third terminal of the second transistor is coupled to the second group of light sensors.

4. The processing device for position sensing as claimed in claim 3, wherein the signal processing unit further comprises:

a first buffer unit, coupled between the first terminal of the first transistor and the reference voltage, wherein the first buffer unit having a first input terminal, a second input terminal and an output terminal, the first input terminal of the first buffer unit receives the reference voltage, the second input terminal of the first buffer unit is coupled to the third terminal of the first transistor, and the output terminal of the first buffer unit is coupled to the first terminal of the first transistor; and a second buffer unit, coupled between the first terminal of the second transistor and the reference voltage, wherein the second buffer unit having a first input terminal, a second input terminal and an output terminal, the first input terminal of the second buffer unit receives the reference voltage, the second input terminal of the second buffer unit is coupled to the third terminal of the second transistor, and the output terminal of the second buffer unit is coupled to the first terminal of the second transistor.

5. The processing device for position sensing as claimed in claim 4, wherein the first buffer unit comprises:

a third transistor, having a first terminal, a second terminal and a third terminal, wherein the first terminal of the third transistor serves as the first input terminal of the first buffer unit, the second terminal of the third transistor serves as the output terminal of the first buffer unit, and the third terminal of the third transistor is coupled to a first voltage; and a fourth transistor, having a first terminal, a second terminal and a third terminal, wherein the first terminal of the fourth transistor serves as the second input terminal of the first buffer unit, the second terminal of the fourth transistor is coupled to the second terminal of the third transistor, and the third terminal of the fourth transistor is coupled to a second voltage.

6. The processing device for position sensing as claimed in claim 5, wherein the second buffer unit comprises:

a fifth transistor, having a first terminal, a second terminal and a third terminal, wherein the first terminal of the fifth transistor serves as the first input terminal of the second buffer unit, the second terminal of the fifth transistor serves as the output terminal of the second buffer unit, and the third terminal of the fifth transistor is coupled to the first voltage; and a sixth transistor, having a first terminal, a second terminal and a third terminal, wherein the first terminal of the sixth transistor serves as the second input terminal of the second buffer unit, the second terminal of the sixth transistor is coupled to the second terminal of the fifth transistor, and the third terminal of the sixth transistor is coupled to the second voltage.

7. The processing device for position sensing as claimed in claim 3, wherein the current mirror unit comprises:

a third transistor, having a first terminal, a second terminal and a third terminal, wherein the first terminal and the second terminal of the third transistor are coupled to the second terminal of the first transistor, and the third terminal of the third transistor is coupled to a first voltage; and a fourth transistor, having a first terminal, a second terminal and a third terminal, wherein the first terminal of the fourth transistor is coupled to the first terminal of the third transistor, the second terminal of the fourth transistor is coupled to the node and generates the third current signal, and the third terminal of the fourth transistor is coupled to the first voltage.

8. The processing device for position sensing as claimed in claim 1, wherein the transforming unit comprises:

a resistor, having a first terminal and a second terminal, wherein the first terminal of the resistor is coupled to the node and outputs the voltage signal, and the second terminal of the resistor is coupled to a first voltage.

9. The processing device for position sensing as claimed in claim 1, wherein the transforming unit comprises:

a buffer unit, having a first input terminal, a second input terminal and an output terminal, wherein the first input terminal of the buffer unit receives a reference voltage, the second input terminal of the buffer unit is coupled to the node, and the output terminal of the buffer unit outputs the voltage signal;

a resistor, having a first terminal and a second terminal, wherein the first terminal of the resistor is coupled to the second input terminal of the buffer unit, and the second terminal of the resistor is coupled to the output terminal of the buffer unit; and a capacitor, having a first terminal and a second terminal, wherein the first terminal of the capacitor is coupled to the first terminal of the resistor, and the second terminal of the capacitor is coupled to the second terminal of the resistor.

10. The processing device for position sensing as claimed in claim 1, further comprising:

an energy storage unit, coupled to the transforming unit, receiving the voltage signal to generate an energy storage signal.

11. The processing device for position sensing as claimed in claim 10, further comprising:

a first switch unit, coupled to the energy storage unit and controlled by a first control signal; and a buffer unit, coupled to the first switch unit, wherein the buffer unit buffers the energy storage signal of the energy storage unit to provide an output signal when the first switch unit is turned on.

12. The processing device for position sensing as claimed in claim 11, wherein the buffer unit comprises:

a second switch unit, coupled to the first switch unit and a reference voltage, and controlled by a second control signal;

a first capacitor, having a first terminal and a second terminal, wherein the first terminal of the first capacitor is coupled to the second switch unit;

a second capacitor, having a first terminal and a second terminal, wherein the first terminal of the second capacitor receives the reference voltage;

an amplifier, having a first input terminal, a second input terminal, a first output terminal and a second output terminal, wherein the first input terminal of the amplifier is coupled to the second terminal of the first capacitor, the second input terminal of the amplifier is coupled to the second terminal of the second capacitor, and the first output terminal and the second output terminal of the amplifier provide the output signal;

a third capacitor, having a first terminal and a second terminal, wherein the first terminal of the third capacitor is coupled to the first terminal of the amplifier, and the second terminal of the third capacitor is coupled to first output terminal of the amplifier;

a third switch unit, coupled to the third capacitor in parallel, and controlled by the second control signal;

a fourth capacitor, having a first terminal and a second terminal, wherein the first terminal of the fourth capacitor is coupled to the second input terminal of the amplifier, and the second terminal of the fourth capacitor is coupled to the second output terminal of the amplifier; and a fourth switch unit, coupled to the fourth capacitor in parallel, and controlled by the second control signal;

wherein the first control signal is complementary to the second control signal.

* * * * *